US009972723B2

United States Patent
Al Ahmad et al.

(10) Patent No.: US 9,972,723 B2
(45) Date of Patent: May 15, 2018

(54) PIEZOELECTRIC THIN-FILM BASED FLEXIBLE SENSING DEVICE, METHOD FOR FABRICATION THEREOF AND METHOD FOR OPERATING THE SAME

(71) Applicants: United Arab Emirates University, Al Ain (AE); Khalif University of Science and Technology, Abu Dhabi (AE)

(72) Inventors: Mahmoud Al Ahmad, Al Ain (AE); Irfan Saadat, Abu Dhabi (AE); Taryam Al Shamsi, Abu Dhabi (AE)

(73) Assignees: United Arab Emirates University, Al Ain (AE); Khalifa University of Science and Technology, Abu Dhabi (AE)

( * ) Notice: Subject to any disclaimer, the term of this patent is extended or adjusted under 35 U.S.C. 154(b) by 557 days.

(21) Appl. No.: 14/621,126

(22) Filed: Feb. 12, 2015

(65) Prior Publication Data
US 2016/0240766 A1 Aug. 18, 2016

(51) Int. Cl.
*H01L 41/04* (2006.01)
*H01L 29/84* (2006.01)
*G01L 1/16* (2006.01)
*H01L 29/24* (2006.01)

(52) U.S. Cl.
CPC ........... *H01L 29/84* (2013.01); *G01L 1/16* (2013.01); *H01L 29/24* (2013.01)

(58) Field of Classification Search
CPC .............. H01L 41/04; G01L 1/16; G01L 1/18
See application file for complete search history.

(56) References Cited

U.S. PATENT DOCUMENTS

| 3,351,786 A | 11/1967 | Muller et al. | |
|---|---|---|---|
| 9,212,895 B2 * | 12/2015 | Suzuki | G01B 7/18 |
| 2005/0193822 A1 * | 9/2005 | Amano | G01L 1/16 73/704 |

(Continued)

OTHER PUBLICATIONS

International Search Report and Written Opinion, International Patent Application No. PCT/IB2016/050716, dated Mar. 30, 2016, 10 pages.

(Continued)

*Primary Examiner* — J. San Martin
(74) *Attorney, Agent, or Firm* — Fitch, Even, Tabin & Flannery LLP

(57) ABSTRACT

A sensing device, a method for fabrication thereof, and a method for operating the same are disclosed. The sensing device includes a flexible substrate, a first metallization layer, a piezoelectric thin film layer, a second metallization layer, and an insulating layer. The first metallization layer forms at least a source region and at least a drain region. The piezoelectric thin film layer provides a channel region permitting passage of charge carriers between the source region and the drain region. The second metallization layer forms at least a gate electrode and regulates flow of charge carriers through the piezoelectric thin film layer. When subjected to an external force, the flow of charge carriers is modulated in response to a strain in the piezoelectric thin film layer. The force is measured as a correlation between the applied force and the modulation of the flow of charge carriers.

18 Claims, 10 Drawing Sheets

(56) References Cited

U.S. PATENT DOCUMENTS

| | | | | |
|---|---|---|---|---|
| 2007/0272922 A1* | 11/2007 | Kim | ................... | H01L 29/7869 257/43 |
| 2009/0127977 A1* | 5/2009 | So | ...................... | H01L 29/4908 310/322 |
| 2011/0049579 A1* | 3/2011 | Dumitru | ................ | B82Y 10/00 257/254 |
| 2016/0258829 A1* | 9/2016 | Celik-Butler | ........... | H01L 41/37 |

OTHER PUBLICATIONS

Jae-Min Kim et al., "Atomic Layer Deposition ZnO:N Flexible Thin Film Transistors and The Effects of Bending on Device Properties." Applied Physics Letters, Apr. 7, 2011, vol. 98, pp. 142113-1 to 142113-3.

* cited by examiner

PIEZOELECTRIC THIN-FILM BASED FLEXIBLE SENSING DEVICE, METHOD FOR FABRICATION THEREOF AND METHOD FOR OPERATING THE SAME

BACKGROUND OF THE PRESENT INVENTION

Technical Field

The present invention generally relates to sensing devices. More specifically, the present invention relates to a piezoelectric thin-film based flexible sensing device, a method for fabrication thereof, and a method for operating the same.

Description of the Related Art

Various techniques for sensing impact events, and in particular, force and/or pressure have been investigated in the art in recent years. Such sensors include for example, mechanoluminescence detection, fibre-optical properties of semiconductor materials based sensor, wide spectrum acoustic emission (AE) wave-based sensors, and inertial mass variation based sensors. Such sensors require complex fabrication process, high accuracy adjunct measurement instruments, dedicated setting up, and not the least, highly skilled technicians to carry out the measurements. The prior art techniques are not only expensive but also lack desired versatility.

Detection and measurement techniques using bulk piezoceramics and readily available polyvinylidene fluoride (PVDF) films have also been reported. However, the integration of the bulk materials and PVDF wearable films with Micro Electro Mechanical System (MEMS) requires state-of-the-art fabrication techniques. Such emerging techniques are still in early stages of research and are not commercially viable owing to difficulty in miniaturization and challenges in designing batch fabrication processes for mass production of such sensors.

While research efforts have been made to integrate piezoelectric materials in thin-film transistors produced using standard semiconductor fabrication process, the inherent constraint related to process temperature remains unaddressed. Various piezoelectric materials have a relatively low Curie point (90° C.), above which the piezoelectric properties are lost. Thus, traditional fabrications techniques employed for silicon transistors, which usually require higher temperatures, inherently prohibit integrating piezoelectric thin-films with standard transistors.

In light of the foregoing, there is a need for providing a flexible sensing device conducive to low cost fabrication under low temperature conditions and providing enhanced sensitivity.

SUMMARY OF THE PRESENT INVENTION

It is an object of the present invention to provide a flexible sensing device incorporating a piezoelectric thin-film for sensing force such that the sensing device is conducive to low cost fabrication under low temperature conditions and in addition, highly sensitive.

It is another object of the present invention to provide a method for fabricating a flexible sensing device incorporating a piezoelectric thin-film for sensing force.

It is yet another object of the present invention to provide a method for operating a flexible sensing device incorporating a piezoelectric thin-film for sensing force.

The objects of the present invention are achieved through a sensing device, a method for fabrication thereof, and a method for operating the sensing device as described herein.

The underlying concept of the present invention is to provide a sensing device wherein source and drain regions are formed using a first metallisation layer and a channel therebetween is provided using a piezoelectric thin-film layer. A second metallisation layer is operatively coupled to a combination of the first metallisation layer and the piezoelectric thin-film layer through an insulating layer disposed therebetween. The aforementioned layers are disposed on a flexible substrate.

As will be evident, such arrangement of layers is analogous to a conventional thin-film transistor device. Thus, a sensing device analogous to a conventional thin-film transistor incorporating a piezoelectric thin film layer is provided. Evidently, unlike a conventional thin-film transistor device, source and drain regions are formed using a metallisation layer while the intermediate channel permitting flow of charge carriers is implemented using the piezoelectric thin film layer. Thus, the sensing device of the present invention is advantageously not constrained by the process conditions required for conventional silicon based fabrication. On the contrary, the sensing device of the present invention is produced using various deposition techniques that permit low temperature fabrication process.

The formation of source and drain regions using metallisation techniques results in increased sensitivity of the sensing device. The force applied to the sensing device is measured through determining modulation of the flow of charge carriers between source and drain regions. The source-drain current, in turn, is modelled based on a first piezoelectric constant (d) relating to electric field displacement and a second piezoelectric constant (g) relating to electric field, each corresponding to a polar axis of the piezoelectric thin film layer and a plane orthogonal to the polar axis for determining mechanical deformation of the sensing device and in turn, mechanical force causing such mechanical deformation.

In a first aspect of the present invention, a sensing device is provided. The sensing device comprises a flexible substrate, a first metallisation layer, a piezoelectric thin film layer, a second metallisation layer, and an insulating layer. The first metallization layer forms at least a source region and at least a drain region. The piezoelectric thin film layer provides a channel region permitting passage of charge carriers between the source region and the drain region. The second metallization layer forms at least a gate electrode. The insulating layer is disposed intermediate the piezoelectric thin film layer and the second metallization layer, wherein the gate electrode facilitates regulation of a flow of charge carriers through the piezoelectric thin film layer, and wherein the flow of charge carriers is modulated in response to a strain in the piezoelectric thin film layer.

In a second aspect of the present invention, a method for fabricating a sensing device is provided. At a first step, a flexible substrate is provided. In subsequent steps, a first metallization layer, a piezoelectric thin film layer, a second metallisation layer, and an insulating layer are provided, not necessarily in that order. The first metallization layer forms at least a source region and at least a drain region. The piezoelectric thin film layer provides a channel region permitting passage of charge carriers between the source region and the drain region. The second metallization layer forms at least a gate electrode. The insulating layer is disposed intermediate the piezoelectric thin film layer and the second metallization layer, wherein the gate electrode facilitates regulation of a flow of charge carriers through the piezoelectric thin film layer, and wherein the flow of charge carriers is modulated in response to a strain in the piezoelectric thin film layer.

In a third aspect of the present invention, a method for operating a thin-film transistor based sensing device is provided. The sensing device comprises a flexible substrate, a first metallization layer forming at least a source region and at least a drain region, a piezoelectric thin film layer providing a channel region permitting passage of charge carriers between the source region and the drain region, a second metallization layer forming at least a gate electrode, an insulating layer disposed intermediate the piezoelectric thin film layer and the second metallization layer. At a first step, a biasing voltage is provided across the source and the drain regions. Subsequently, a control voltage is provided to the gate electrode for regulating a flow of charge carriers between the source and the drain regions through the piezoelectric thin film layer. As and when a force is applied to the sensing device, modulation of the flow of charge carriers in response to a strain in the piezoelectric thin film layer is determined, and thereafter, an applied force provided to the sensing device is determined based on a correlation between the applied force and resulting modulation of the flow of charge carriers.

As will be evident, the present invention provides a sensing device that is analogous to a thin-film transistor but formed using fabrication techniques and materials that are conducive to low temperature fabrication process.

The sensing device of the present invention is inherently low cost and has improved operational parameters in comparison to conventional silicon based systems especially for large area applications.

BRIEF DESCRIPTION OF THE DRAWINGS

The present invention is further described hereinafter with reference to illustrated embodiments shown in the accompanying drawings, in which.

DETAILED DESCRIPTION OF THE PRESENT INVENTION

Figure 1:
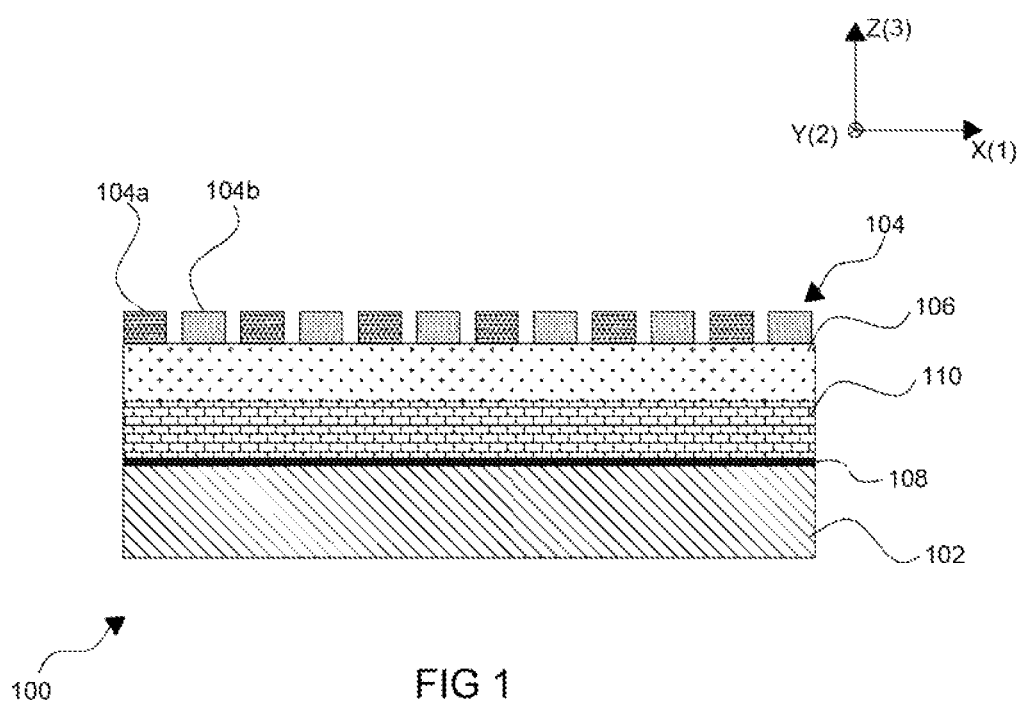
FIG. 1 illustrates a cross-sectional view of a sensing device in accordance with an exemplary embodiment of the present invention.

Various exemplary embodiments are described with reference to the drawings, wherein like reference numerals are used to refer to like elements throughout. In the following description, for purpose of explanation, numerous specific details are set forth in order to provide a thorough understanding of one or more embodiments. It may be evident that such embodiments may be practised without these specific details.

Referring now to FIG. 1, a cross-sectional view of a sensing device 100 is illustrated in accordance with an exemplary embodiment of the present invention.

The sensing device 100 includes a flexible substrate 102, a first metallisation layer 104, a piezoelectric thin film layer 106, a second metallisation layer 108, and an insulating layer 110.

The first metallisation layer 104 forms at least a source region 104a and at least a drain region 104b. The piezoelectric thin film layer 106 provides a channel region permitting passage of charge carriers between the source region 104a and the drain region 104b. The second metallisation layer 108 forms at least a gate electrode. In one exemplary embodiment the second metallisation layer 108 is deposited as a uniform layer and in this case, the terms second metallisation layer and the gate electrode are used interchangeably. The insulating layer 110 is disposed intermediate the piezoelectric thin film layer 106 and the second metallisation layer 108. The gate electrode 108 facilitates regulation of a flow of charge carriers between the source region 104a and the drain region 104b through the piezoelectric thin film layer 106. The flow of charge carriers is modulated in response to a strain in the piezoelectric thin film layer 106.

It should be noted that various layers included in the sensing device 100 may be arranged in several different relative positions while still achieving the desired functionality of the device, as will be apparent from various alternative arrangements explained in conjunction with FIG. 5 through FIG. 8. In all such different arrangements, the first metallisation layer 104 is electrically coupled to the piezoelectric thin film layer 106, which provides a conductive path for flow of charge carriers between the source region 104a and the drain region 104b.

The flexible substrate 102 can be formed of any flexible material that is compatible with electronic processing. In one example, the flexible substrate 102 is formed using polyethylene napthalate. The flexible substrate provides basic support structure for supporting stack of various layers in the sensing device 100. Owing to its flexibility the flexible substrate 102 permits deformation of stack of various layers in the sensing device 100, substantially along z-axis upon the application of force.

As mentioned above, the first metallisation layer 104 is deposited such as to form at least a source region 104a and a drain region 104b.

Figure 3:
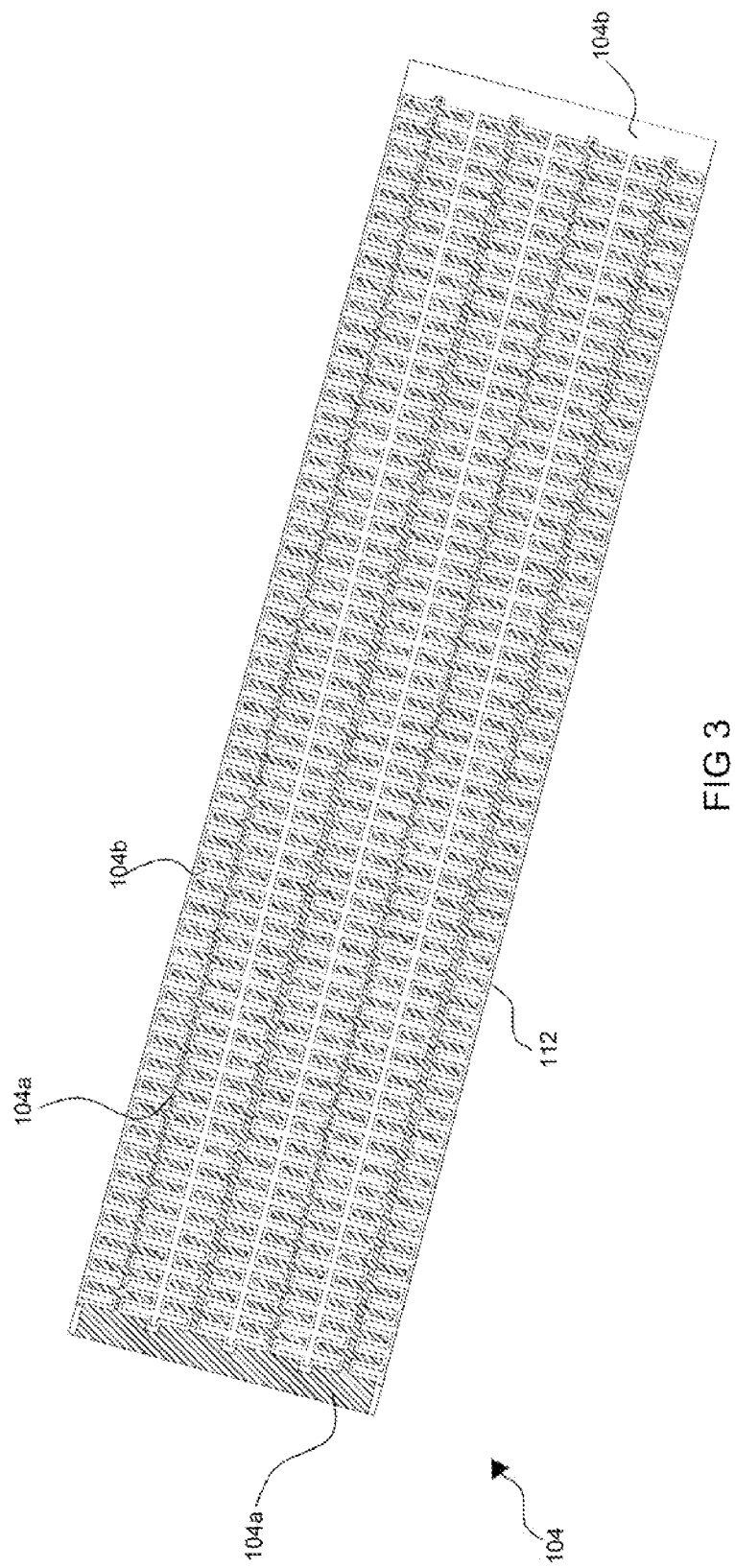
FIG. 3 illustrates a schematic view of a first metallisation layer in accordance with an exemplary embodiment of the present invention.
Figure 4:
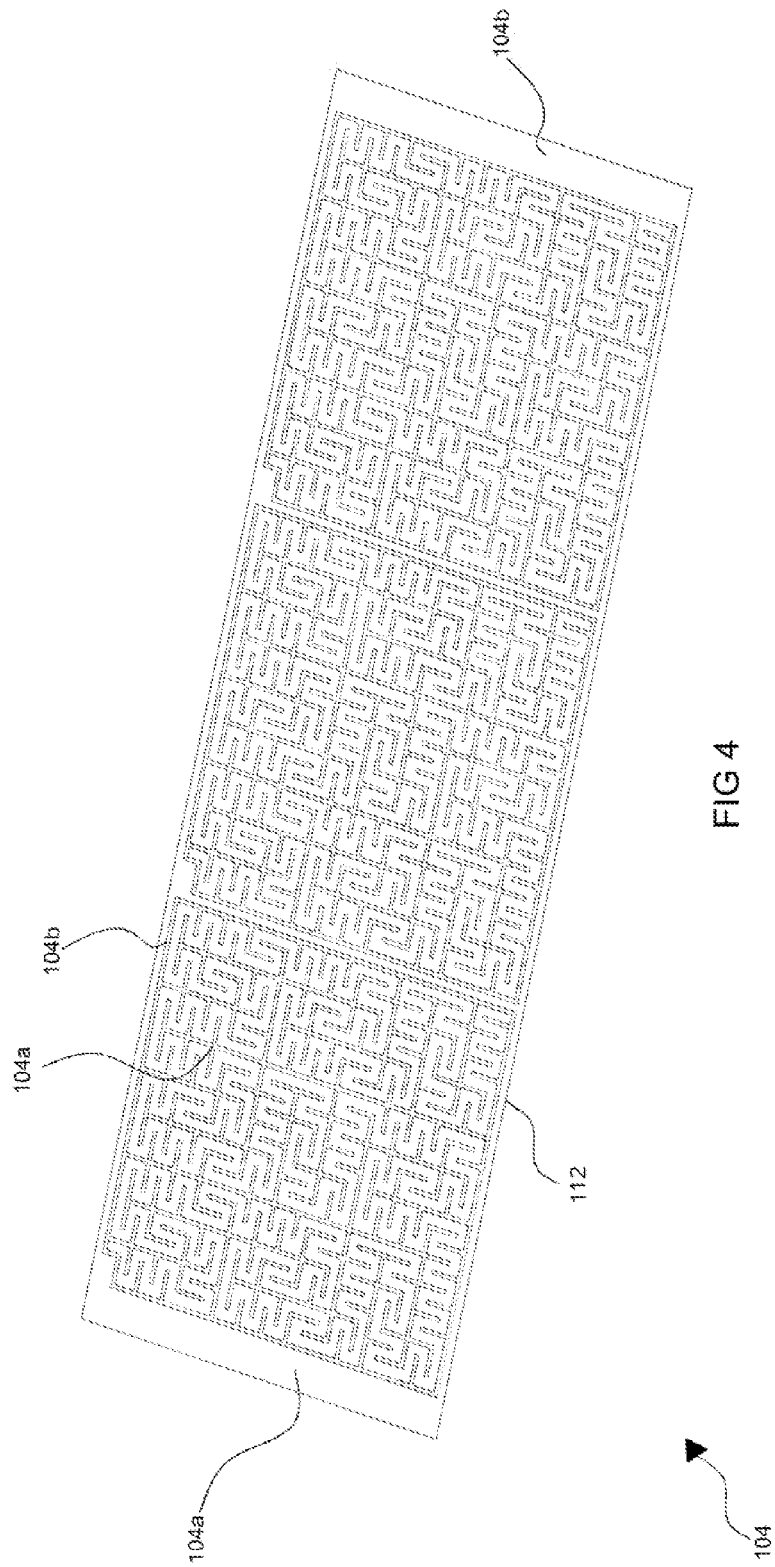
FIG. 4 illustrates a schematic view of a first metallisation layer in accordance with an alternative embodiment of the present invention.

Referring now to FIGS. 3 and 4, a schematic view of a first metallisation layer is illustrated in according with two exemplary embodiments of the present invention.

In one exemplary embodiment of the present invention, the first metallization layer 104 is disposed in such manner as to form an interdigitated structure forming a plurality of pairs of source and drain electrodes 104a, 104b.

In a further embodiment of the present invention, the first metallization layer 104 is disposed to form a fractal structure forming a plurality of pairs of source and drain electrodes 104a, 104b.

As will be readily appreciated, interdigitated and fractal arrangements increase an effective surface area between the source region 104a and the drain region 104b across the piezoelectric thin film layer 106 through which electrical current is capable of flowing between the source and drain electrodes 104a, 104b.

When the first metallization layer 104 is disposed to form multiple individual source and drain electrodes 104a, 104b, in the form of interdigitated or fractal structures, an electrical current flowing across the source and the drain regions 104a, 104b is cumulative of individual electrical currents flowing between individual pairs of source and drain electrodes 104a, 104b.

In an exemplary embodiment of the present invention, the source region 104a and the drain region 104b are formed using same metal. Thus, the source region 104a and the drain region 104b have the same metal function. The source region 104a and the drain region 104b are arranged to form Ohmic contacts with the piezoelectric thin film layer 106.

In an alternative embodiment of the present invention, the source region 104a and the drain region 104b are formed using different metals providing different metal functions. The source region 104a and the drain region 104b are arranged to form Schottky transistor with the piezoelectric thin film layer 106. This arrangement is particularly advantageous when it is desired to avoid saturation of the thin-film transistor through diverting a part of an electrical current.

Referring back to FIG. 1, the piezoelectric thin film layer 106 provides a path for flow of charge carriers between source region 104a and the drain region 104b. In various exemplary embodiments, any suitable piezoelectric material may be used.

In one exemplary embodiment of the present invention, the piezoelectric thin film layer 106 is formed using Zinc Oxide (ZnO). Zinc Oxide is a wide band-gap semiconductor material which has good transparency, high electron mobility and strong room temperature luminescence.

Zinc Oxide is particularly advantageous due to relative ease of deposition on a wide variety of materials. ZnO is a compositionally simple piezoelectric material and thin films formed using ZnO do not require any electric-thermal poling, which is necessary for other commonly used piezoelectric materials. Additionally, ZnO thin film possesses higher value of piezoelectric coupling coefficient relative to other piezoelectric materials such as Aluminium Nitride (AlN). Moreover, deposition of ZnO permits greater control of texture, stoichiometry, and other properties.

It should be noted that the piezoelectric thin film layer 106 is formed in such manner that the polar axis (3) is substantially orthogonal to a plane along which the piezoelectric thin film layer 106 extends. Thus, in the adjoining figures, the piezoelectric thin film layer 106 extends along the X-Y plane while the polar axis is extends along the Z axis.

In an exemplary embodiment of the present invention, the piezoelectric thin film layer 106 is fabricated using nanotechnology. In this embodiment, the piezoelectric thin film layer 106 is fabricated using nano-particles, nano-wires, or nano-tubes and therefore, the piezoelectric thin film layer 106 is effectively a nano-composite thin film. In one particular example, ZnO nano-particles are used to fabricate the thin-film. This is particularly advantageous as use of ZnO nano-particles may be easily functionalised to fabricate thin-film semiconductors while retaining the piezoelectric properties and importantly, such ZnO based thin films may be fabricated under substantially reduced temperature conditions relative to the conventional silicon based fabrication technology.

The second metallisation layer 108 forming the gate electrode 108 is adapted for receiving a control voltage for regulating a flow of charge carriers between said source region 104a and said drain region 104b through said piezoelectric thin film layer 106. The gate electrode 108 may be formed from any conductive material that provides the desired charge control function required for the application of the device in question.

The insulating layer 110 electrically isolates the second metallisation layer 108 from the piezoelectric thin film layer 106. In various implementations, any suitable electrically insulating material known in the art such as silicon dioxide ($SiO_2$), aluminium oxide ($Al_2O_3$), and the like may be used to form the insulating layer 110.

Each of these layers are deposited through a suitable thin film deposition technique conducive to low temperature fabrication such as physical vapour deposition, chemical vapour deposition, atomic layer deposition, spin on, dispersion, screen printing, ink jet printing, electron beam processing and thermal evaporation, and the like.

As will now be apparent, the sensing device 100 of the present invention is effectively an array of multiple individual thin-film transistors. Each individual thin-film transistor consists of individual source electrode 104a and individual drain electrode 104b, in interdigitated or fractal form, the channel being formed through the portion of the piezoelectric thin film layer 106 therebetween. The regulation of the flow of charge carriers being achieved through a gate voltage applied to the second metallisation layer 108.

In accordance with this technical feature, sensitivity of the sensing device 100 towards external force applied thereto is advantageously enhanced significantly. This technical effect is attributable to a measurable variation in electrical current flowing between the source and the drain electrodes in individual thin-film transistors even with relatively small localized deformation in the piezoelectric thin film layer 106.

Figure 2:
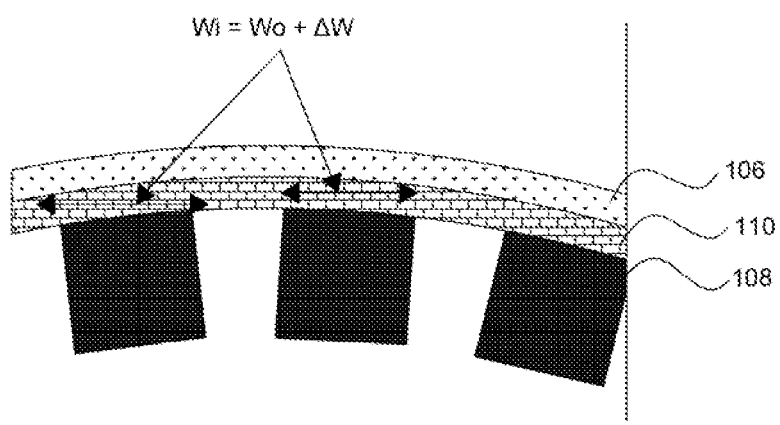
FIG. 2 illustrates a partial cross-sectional view of a sensing device under strain in accordance with an exemplary embodiment of the present invention.

Referring now to FIG. 2, a partial cross-sectional view of a sensing device 100 under strain is illustrated in accordance with an exemplary embodiment of the present invention.

In particular, deformation of the sensing device 100 results in altering dimensions of piezoelectric thin film layer 106, which provides a channel between neighbouring source and drain electrodes. Such alternation in dimensions of the channel between the neighbouring source and drain electrodes compounded with electric displacement field generated within the piezoelectric thin film layer 106 modulates the flow of charge carriers between the source region 104a and the drain region 104b.

As will be appreciated, the electrical current ($I_{DS}$) between the source electrode 104a and the drain electrode 104b in an individual transistor in the sensing device 100 is determined using the following equation:

$$I_{DS} = \frac{\mu W_i C_i}{2L}(V_G - V_T)^2 \qquad (1)$$

where, $I_{DS}$ is drain-to-source current in $i^{th}$ transistor

μ is charge carrier effective mobility
$W_i$ is effective gate width of $i^{th}$ transistor
$C_i$ is gate capacitance of $i^{th}$ transistor
L is channel length of an individual transistor
$V_G$ is gate voltage
$V_T$ is threshold voltage According to the techniques of the present invention, when subjected to a force, the deviation in the gate width of an individual thin-film transistor is modelled in terms of a first piezoelectric constant (d) and a second piezoelectric constant (g), each corresponding to a polar axis of the piezoelectric thin film layer 106 and a plane (X-Y plane) orthogonal to said polar axis (z-axis).

The effective gate width is represented by the following equation:

$$W_i = W_0 + \Delta W \quad (2)$$

where,
$W_i$ is effective gate width of $i^{th}$ transistor
$W_0$ is normal gate width
$\Delta W$ is deviation in gate width The deviation in gate width is modelled using the following equation:

$$\Delta W = \frac{d_{33} g_{33} TF}{LW} \quad (3)$$

where,
$d_{33}$ is the piezoelectric charge coefficient corresponding to induced polarisation along z-axis (direction 3 or polar axis in the piezoelectric material) per unit stress applied along z-axis,
$g_{33}$ is the piezoelectric voltage coefficient corresponding to induced electric field along z-axis (direction 3 or polar axis in the piezoelectric material) per unit stress applied along z-axis
T is thickness of the piezoelectric thin film layer 106
L is length of the piezoelectric thin film layer 106 in the $i^{th}$ transistor
W is width of the piezoelectric thin film layer 106 in the $i^{th}$ transistor
F is force applied to the sensing device 100

Once the force applied to the sensing device 100 is determined, the pressure may be readily deduced based on area of the sensing device 100 that the force is applied to.

As will now be appreciated, the effective gate width of individual transistors is modelled using the piezoelectric constant (d) and the piezoelectric constant (g) and accordingly, the techniques of the present invention relate the drain-to-source in individual transistors taking into account variation in dimensions of gate channel as well as the electric displacement field and the electric field produced inside the piezoelectric thin film layer 106.

Referring now to FIGS. 5 through 8, cross-sectional views of the sensing device 100 in accordance with various alternative embodiments of the present invention are illustrated.

As previously explained, the relative placement of various layers in the sensing device 100 may be altered in any desired manner so long as the piezoelectric thin film layer 106 is electrically coupled to the first metallisation layer 104 such as to provide a path for flow of charge carriers between source region 104a and the drain region 104b.

Figure 5:
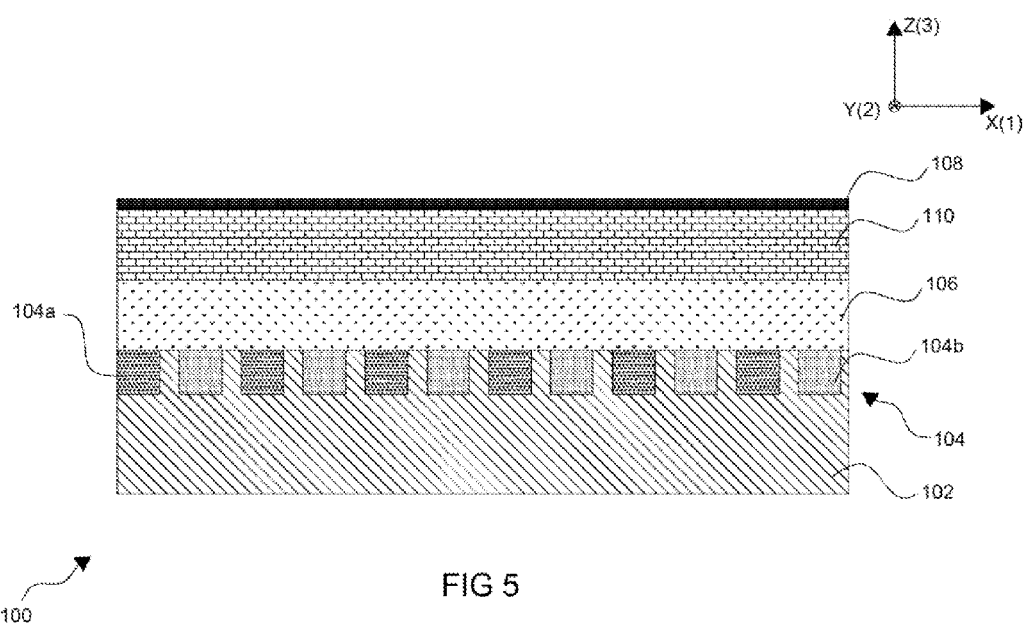
FIG. 5 illustrates a cross-sectional view of a sensing device in accordance with an alternative embodiment of the present invention.

Referring particularly to FIG. 5, the first metallisation layer 104 is deposited directly onto the flexible substrate 102, followed by the piezoelectric thin film layer 106, the insulating layer 110, and the second metallisation layer 108, in that order.

Figure 6:
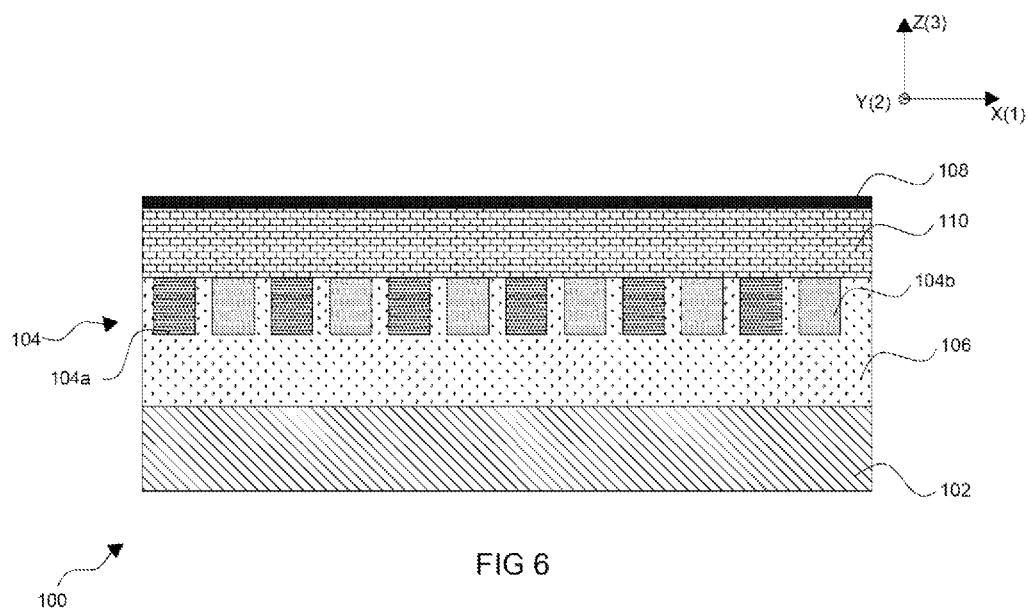
FIG. 6 illustrates a cross-sectional view of a sensing device in accordance with an alternative embodiment of the present invention.

Referring particularly to FIG. 6, the piezoelectric thin film layer 106 is deposited on to the flexible substrate 102, followed by first metallisation layer 104, the insulating layer 110, and the second metallisation layer 108, in that order.

Figure 7:
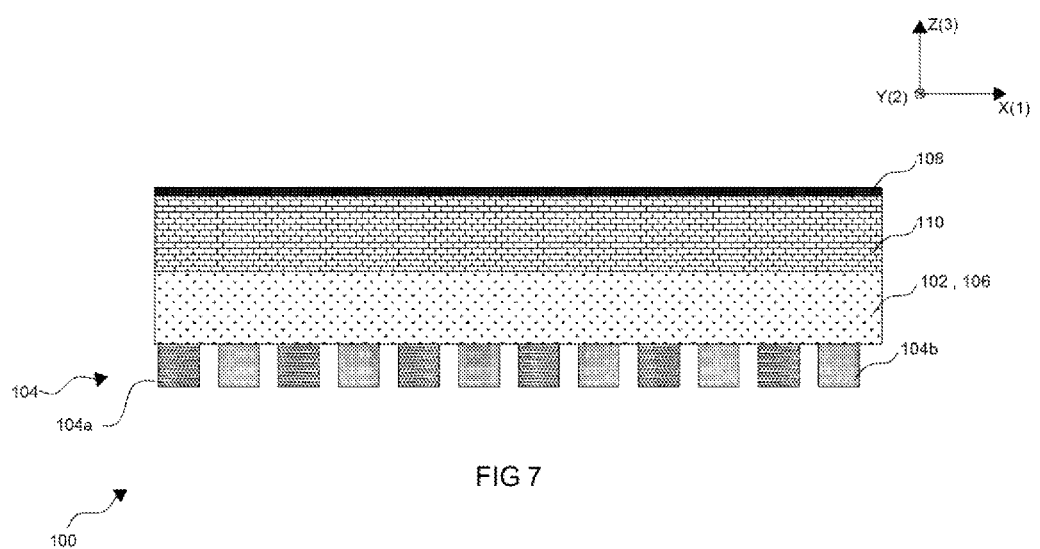
FIG. 7 illustrates a cross-sectional view of a sensing device in accordance with an alternative embodiment of the present invention.

Referring particularly to FIG. 7, the piezoelectric thin film layer 106 is integrated with the flexible substrate 102 such as to form a composite component of the sensing device 100. As can be seen in this figure, the insulating layer 110 and the second metallisation layer 108 are deposited on one side of the combination of flexible substrate 102 and piezoelectric thin film layer 106, while the first metallisation layer 104 is deposited on the opposite side of the combination of the flexible substrate 102 and the piezoelectric thin film layer 106.

Figure 8:
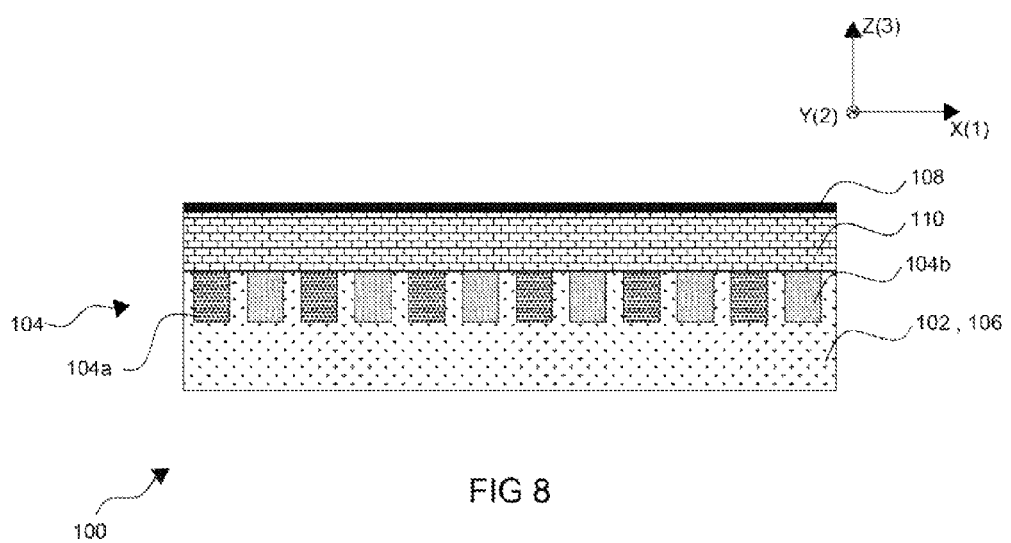
FIG. 8 illustrates a cross-sectional view of a sensing device in accordance with an alternative embodiment of the present invention.

Referring particularly to FIG. 8, a further variation of embodiment shown in FIG. 7 is depicted in accordance with an embodiment of the present invention. The piezoelectric thin film layer 106 is integrated with the flexible substrate 102 such as to form as a composite component of the sensing device 100. As can be seen in this figure, the first metallisation layer 104, the insulating layer 110, and the second metallisation layer 108 are deposited on one side of the combination of flexible substrate 102 and piezoelectric thin film layer 106.

The embodiments shown in FIGS. 7 and 8 may be fabricated through use of a sacrificial substrate. The piezoelectric thin film layer 106, first metallisation layer 104, the insulating layer 110, and the second metallisation layer 108 are deposited in the desired order, and the sacrificial substrate is then removed. Thus, in these embodiments, the piezoelectric thin film layer 106 and the flexible substrate 102 are integrated to form a composite component of the sensing device 100.

The combination of individual layers 102 through 110 in the sensing device 100 are collectively clamped at mutually opposite ends across at least one planar axis (say, x-axis) such that the piezoelectric thin film layer 106 is permitted to be strained in response to stress applied at least partially along a polar axis of the piezoelectric thin film layer. In one example, the individual layers 102 through 110 are clamped along opposite ends across x-axis as well as those across y-axis.

Figure 9:
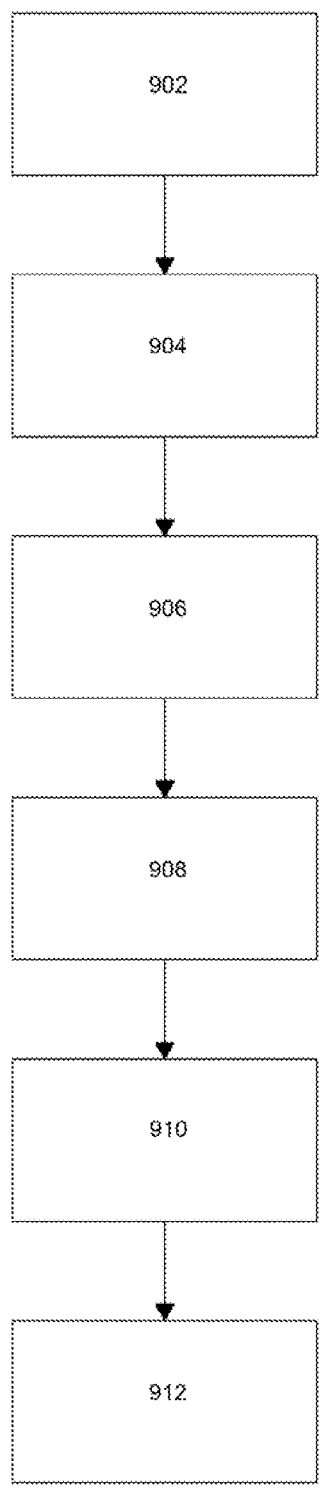
FIG. 9 illustrates a block diagram depicting a method for fabricating a sensing device in accordance with an exemplary embodiment of the present invention.

Referring now to FIG. 9, a block diagram depicting a method for fabricating a sensing device is provided in accordance with an exemplary embodiment of the present invention.

At step 902, a flexible substrate 102 is provided. Subsequently, at steps 904 through 910, a first metallisation layer 104, a piezoelectric thin film layer 106, a second metallisation layer 108, and an insulating layer 110 are provided, not necessarily in that order. As will be readily understood based on the description provided in conjunction with the preceding figures, the steps involved in the method of fabrication of the sensing device 100 may be performed in several different orders.

The first metallisation layer 104 forms at least a source region 104a and at least a drain region 104b. The piezoelectric thin film layer 106 provides a channel region permitting passage of charge carriers between the source region 104a and the drain region 104b. The second metallisation layer 108 forms at least a gate electrode. The insulating layer 110 is disposed intermediate the piezoelectric thin film layer 106 and the second metallisation layer 108, wherein the gate electrode facilitates regulation of a flow of charge carriers through the piezoelectric thin film layer 106, and wherein the flow of charge carriers is modulated in response to a strain in the piezoelectric thin film layer 106.

Finally, at step 912, the combination of individual layers 102 through 110 in the sensing device 100 are collectively clamped at mutually opposite ends across at least one planar axis (say, x-axis) such that the piezoelectric thin film layer 106 is permitted to be strained in response to stress applied at least partially along a polar axis of the piezoelectric thin film layer. In one example, the individual layers 102 through 110 are clamped along opposite ends across x-axis as well as those across y-axis.

Figure 10:
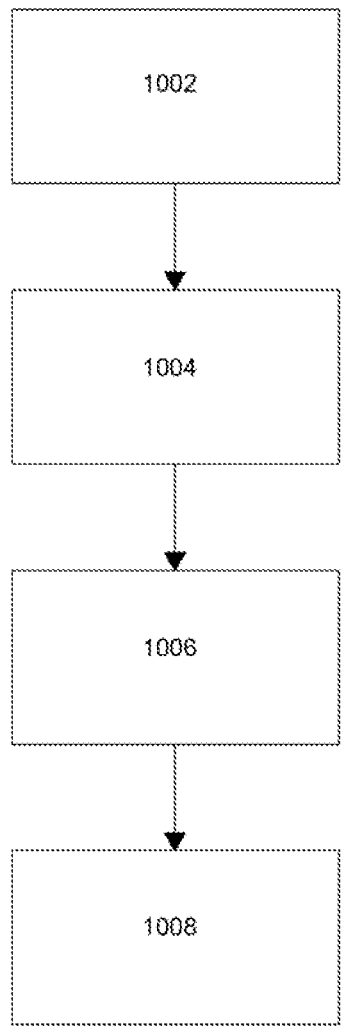
FIG. 10 illustrates a block diagram depicting a method for operating a sensing device in accordance with an exemplary embodiment of the present invention.

Referring now to FIG. 10, a block diagram depicting a method for operating a sensing device is provided in accordance with an exemplary embodiment of the present invention.

As explained in the preceding description, the sensing device 100 is, in effect, an array of multiple thin-film transistors. Such array of multiple thin-film transistors is formed using the flexible substrate 102, a first metallisation layer 104 forming at least a source region 104a and at least a drain region 104b, a piezoelectric thin film layer 106 providing a channel region permitting passage of charge carriers between the source region 104a and the drain region 104b, a second metallisation layer 108 forming at least a gate electrode, an insulating layer 110 disposed intermediate the piezoelectric thin film layer 106 and the second metallisation layer 108.

At step 1002, a biasing voltage is provided across the source region 104a and the drain region 104b. Subsequently, at step 1004, a control voltage is provided to the gate electrode for regulating a flow of charge carriers between the source region 104a and the drain region 104b through the piezoelectric thin film layer 106. Subsequent to application of a force to the sensing device 100, at step 1006, the modulation of the flow of charge carriers in response to a strain in the piezoelectric thin film layer 106 is determined. Finally, at step 1008, the applied force provided to the sensing device is determined based on a correlation between the applied force and resulting modulation of the flow of charge carriers. Thus, the correlation is based on modelling deviation in an equivalent gate width of the sensing device in terms of a first piezoelectric constant (d) and a second piezoelectric constant (g), each corresponding to a polar axis (z-axis) of said piezoelectric thin film layer and a plane (X-Y Plane) orthogonal to the polar axis (z-axis), in accordance with equations (1) through (3), explained in conjunction with preceding figures.

Thus, in accordance with the description provided herein, the present invention provides a sensing device that is analogous to a thin-film transistor but formed using fabrication techniques and materials that are conducive to low temperature fabrication process.

In accordance with techniques of the present invention, the sensing device advantageously provides improved sensitivity to application of external force thereto.

The sensing device of the present invention is inherently low cost in comparison to conventional silicon based systems especially for large area applications.

Owing to its inherent flexibility, the sensing device may be moulded into any desired form factor and is particularly suitable for use for sensing application in wearable devices that require sensing functionality.

The sensing device of the present invention is suitable for use in a variety of applications and in particular, is suitable for use as sensor. When used as a sensor, the sensing device may be used to measure and/or detect pressure differences or other environmental factors which are capable of causing deformation in the sensing device. As a sensor, the sensing device has potential applications in myriad of fields including, but not limited to, remote sensing, telecommunication devices and biomedical devices. Owing to the ability of the sensing device to deform in response to pressure changes and consequently, generate electrical energy via the piezoelectric effect evidently makes the device suitable for harvesting waste mechanical energy from any desired ambient source.

While the present invention has been described in detail with reference to certain embodiments, it should be appreciated that the present invention is not limited to those embodiments. In view of the present disclosure, many modifications and variations would present themselves, to those of skill in the art without departing from the scope of various exemplary embodiments of the present invention, as described herein. The scope of the present invention is, therefore, indicated by the following claims rather than by the foregoing description. All changes, modifications, and variations coming within the meaning and range of equivalency of the claims are to be considered within their scope.

What is claimed is:

1. A sensing device, said sensing device comprising:
   a flexible substrate;
   a first metallization layer, said first metallization layer forming at least a source region and at least a drain region, said first metallization layer is disposed to form an interdigitated structure forming a plurality of pairs of source and drain electrodes;
   a piezoelectric thin film layer, said piezoelectric thin film layer providing a channel region permitting passage of charge carriers between said source region and said drain region;
   a second metallization layer, said second metallization layer forming at least a gate electrode;
   an insulating layer, said insulating layer disposed intermediate said second metallization layer and said piezoelectric thin film layer,
   wherein said gate electrode facilitates regulation of a flow of charge carriers through said piezoelectric thin film layer, and wherein said flow of charge carriers is modulated in response to a strain in said piezoelectric thin film layer.

2. The sensing device of claim 1, wherein said second metallization layer is disposed on said flexible substrate, followed by said insulating layer, said piezoelectric thin film layer, and said first metallization layer, in said order.

3. The sensing device according to claim 1, wherein said first metallization layer is disposed on said flexible substrate, followed by said piezoelectric thin film layer, said insulating layer, and said second metallization layer, in said order.

4. The sensing device according to claim 1, wherein said piezoelectric thin film layer is disposed on said flexible substrate, followed by said first metallization layer, said insulating layer, and said second metallization layer, in said order.

5. The sensing device of claim 1, wherein said piezoelectric thin film layer is integrated with said flexible substrate, followed by said insulating layer and said second metallization layer, in said order in a first direction and said first metallization layer in a second direction.

6. The sensing device according to claim 1, wherein said piezoelectric thin film layer is formed using Zinc Oxide (ZnO).

7. The sensing device according to claim 1, wherein said layers are collectively clamped at mutually opposite ends across at least one planar axis such that said piezoelectric thin film layer is permitted to be strained in response to stress applied at least partially along a polar axis of said piezoelectric thin film layer.

8. The sensing device according to claim 1, wherein an electrical current flowing across said source and said drain regions is cumulative of individual electrical currents flowing between individual pairs of said plurality of pairs of source and drain electrodes.

9. A method for fabricating a sensing device, said method comprising:
providing a flexible substrate;
providing a first metallization layer, said first metallization layer forming at least a source region and at least a drain region, said first metallization layer is disposed to form an interdigitated structure forming a plurality of pairs of source and drain electrodes;
providing a piezoelectric thin film layer, said piezoelectric thin film layer providing a channel region permitting passage of charge carriers between said source region and said drain region;
providing a second metallization layer, said second metallization layer forming at least a gate electrode; and
providing an insulating layer, said insulating layer disposed intermediate said second metallization layer and said piezoelectric thin film layer,
wherein said gate electrode facilitates regulation of a flow of charge carriers through said piezoelectric thin film layer, and wherein said flow of charge carriers is modulated in response to a strain in said piezoelectric thin film layer.

10. The method of claim 9, wherein said second metallization layer is disposed on said flexible substrate, followed by said insulating layer, said piezoelectric thin film layer, and said first metallization layer, in said order.

11. The method according to claim 9, wherein said first metallization layer is disposed on said flexible substrate, followed by said piezoelectric thin film layer, said insulating layer, and said second metallization layer, in said order.

12. The method according to claim 9, wherein said piezoelectric thin film layer is disposed on said flexible substrate, followed by said first metallization layer, said insulating layer, and said second metallization layer, in said order.

13. The method of claim 9, wherein said piezoelectric thin film layer is integrated with said flexible substrate, followed by said insulating layer and said second metallization layer, in said order in a first direction and said first metallization layer in a second direction.

14. The method according to claim 9, wherein said piezoelectric thin film layer is formed using Zinc Oxide (ZnO).

15. The method according to claim 9, wherein said layers are collectively clamped at mutually opposite ends across at least one planar axis such that said piezoelectric thin film layer is permitted to be strained in response to stress applied at least partially along a polar axis of said piezoelectric thin film layer.

16. The method according to claim 9, wherein an electrical current flowing across said source and said drain regions is cumulative of individual electrical currents flowing between individual pairs of said plurality of pairs of source and drain electrodes.

17. A method for operating a thin-film transistor based sensing device, said sensing device comprising a flexible substrate, a first metallization layer forming at least a source region and at least a drain region, said first metallization layer is disposed to form an interdigitated structure forming a plurality of pairs of source and drain electrodes, a piezoelectric thin film layer providing a channel region permitting passage of charge carriers between said source region and said drain region, a second metallization layer forming at least a gate electrode, an insulating layer disposed intermediate said second metallization layer and said piezoelectric thin film layer, said method comprising:
providing a biasing voltage across said source and said drain regions;
providing a control voltage to the gate electrode for regulating a flow of charge carriers between said source and said drain regions through said piezoelectric thin film layer;
determining modulation of said flow of charge carriers in response to a strain in said piezoelectric thin film layer; and
determining an applied force provided to said sensing device based on a correlation between said applied force and resulting modulation of said flow of charge carriers.

18. The method according to claim 17, wherein said correlation is based on modelling deviation in an equivalent gate width of said sensing device in terms of a first piezoelectric constant (d) and a second piezoelectric constant (g), each corresponding to a polar axis of said piezoelectric thin film layer and a plane orthogonal to said polar axis.

* * * * *